United States Patent [19]

Haferl

[11] 4,079,293
[45] Mar. 14, 1978

[54] SWITCHED MODE VERTICAL AMPLIFIER WITH ELIMINATION OF FEEDBACK RINGING

[75] Inventor: Peter Eduard Haferl, Adliswil, Switzerland

[73] Assignee: RCA Corporation, New York, N.Y.

[21] Appl. No.: 724,551

[22] Filed: Sep. 20, 1976

[30] Foreign Application Priority Data

Mar. 19, 1976 United Kingdom ............... 11270/76

[51] Int. Cl.² ............................................. H01J 29/56
[52] U.S. Cl. ..................... 315/387; 315/403; 315/370
[58] Field of Search ............... 315/387, 389, 370, 403, 315/408, 410; 328/35, 187; 358/222

[56] References Cited

U.S. PATENT DOCUMENTS 3,947,723  3/1976  Thompson ..................... 315/389

Primary Examiner—Maynard R. Wilbur
Assistant Examiner—T. M. Blum
Attorney, Agent, or Firm—Eugene M. Whitacre; Joseph Laks

[57] ABSTRACT

A capacitor is coupled to a vertical deflection winding for forming a resonant circuit therewith during retrace. A switched mode vertical deflection amplifier generates trace current in the deflection winding. A feedback resistor samples the current in the deflection winding and provides a feedback voltage to the amplifier. In order to substantially diminish a ringing component of the trace current at the beginning of trace, a cancellation circuit provides the amplifier with a voltage which cancels the feedback voltage during at least the latter portion of retrace.

9 Claims, 8 Drawing Figures

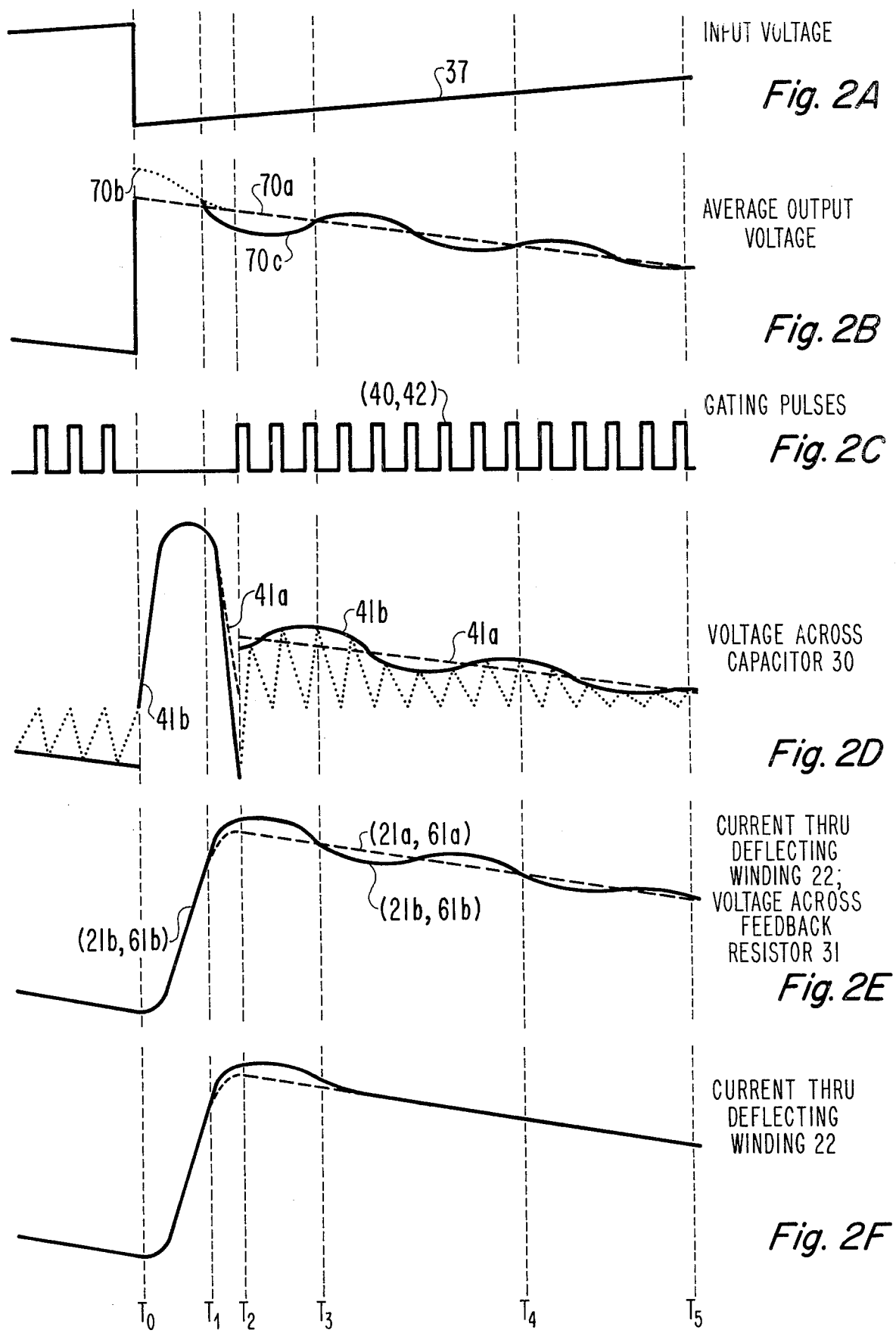

SWITCHED MODE VERTICAL AMPLIFIER WITH ELIMINATION OF FEEDBACK RINGING

This invention relates to switched mode deflection amplifiers.

In a television receiver, a picture is obtained by scanning a video modulated electron beam across the phosphor screen of a cathode ray tube. The electron beam is deflected by a time varying magnetic field produced by deflection currents flowing through horizontal and vertical deflection windings. In order to obtain a linear scan, the current during the trace interval of each deflection cycle must also vary in a linear fashion.

In many systems, a vertical deflection amplifier will provide a linear sawtooth voltage during vertical trace. During vertical retrace, the amplifier is cutoff, and the deflection winding and a retrace capacitor form a resonant circuit for quickly reversing the current in the deflection winding. At the end of retrace, the current has reversed to its start-of-trace value at which time the amplifier is turned on to provide trace current to the winding.

The amplifier, with its low impedance output, also serves to dampen the circulating resonant retrace current in the deflection winding. If the damping is inadequate, an undesirable ringing of the trace current may occur at the beginning of trace, resulting in streaky horizontal lines being observed on the phosphor screen.

In switched mode vertical deflection amplifiers, the amplifier provides trace current only during a fraction of each horizontal trace interval. Elimination of trace current ringing is an important consideration in designing such amplifiers, since the damping property of the amplifier is not available for the entire horizontal trace interval.

SUMMARY OF THE INVENTION

A charge storage element is coupled to a deflection winding for forming a resonant circuit therewith during retrace. A switched mode deflection amplifier generates trace current in the deflection winding. A feedback element samples the current in the deflection winding and provides a feedback voltage to the amplifier. In order to substantially diminish a ringing of the trace current at the beginning of trace, a cancellation circuit provides the amplifier with a voltage which substantially cancels the feedback voltage during at least the latter portion of retrace.

BRIEF DESCRIPTION OF THE DRAWINGS

FIGS. 2A – 2F illustrate waveforms associated with the circuit of FIG. 1; and

DESCRIPTION OF THE INVENTION

Figures 1, 3:
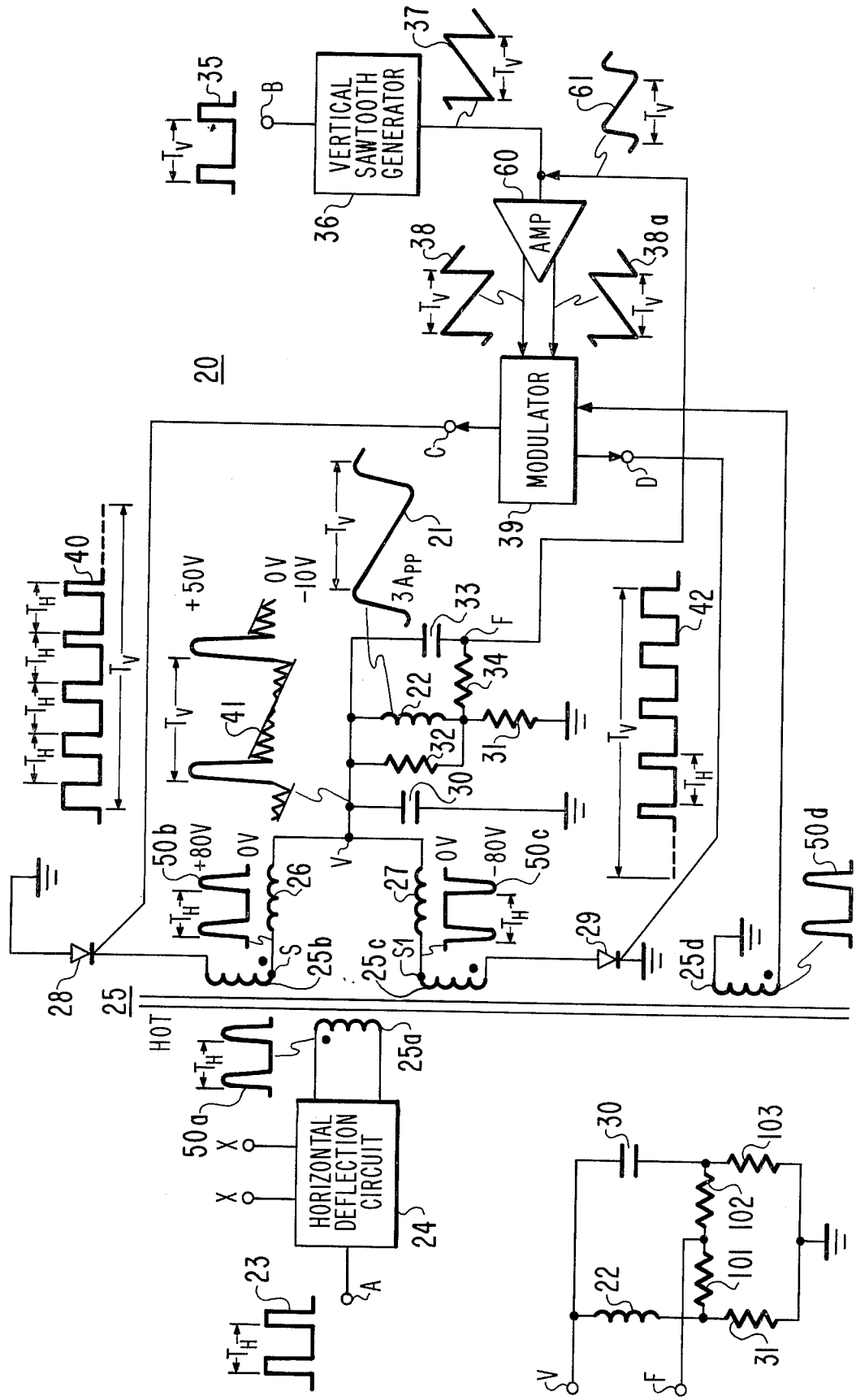
FIG. 1 is a circuit schematic, partially in block form, of a switched mode vertical amplifier embodying the invention.
FIG. 3 is a circuit diagram of the output portion of a switched mode vertical amplifier which includes another embodiment of the invention.

In FIG. 1, a switched mode vertical deflection amplifier 20 supplies current to an output terminal V for generating a scanning current 21 in a vertical deflection winding 22 coupled thereto. Operating voltage is obtained from horizontal retrace pulses coupled to the amplifier from a horizontal deflection circuit 24. For detailed operation of amplifier 20, reference is made to applicant's copending U.S. Patent application entitled, VERTICAL DEFLECTION SYSTEM, Ser. No. 595,809, filed July 14, 1975.

Horizontal sync pulses 23 of frequency $1/T_H$, obtained from a sync separator, not shown, are coupled at terminal A to horizontal deflection circuit 24. Horizontal deflection current is supplied through terminals X—X to a horizontal deflection winding, not shown.

Horizontal retrace pulses 50a are provided by horizontal deflection circuit 24 to a primary winding 25a of a horizontal output transformer 25. Secondary windings 25b and 25c at terminals S and S1 respectively, couple opposite polarity retrace pulses 50b and 50c to output terminal V, each through storage inductors 26 and 27, respectively. Controlled switches SCR 28 and 29 are serially coupled, respectively, to secondary windings 25b and 25c. The anode of SCR 28 and the cathode of SCR 29 are grounded.

Output terminal V is coupled to ground through a capacitor 30 and also through serially coupled deflection winding 22 and a feedback resistor 31. Coupled across deflection winding 22 is a damping resistor 32 and also the serial arrangement of a capacitor 33 and a resistor 34.

The trace current in deflection winding 22 is sampled by feedback resistor 31, and a feedback voltage 61 is obtained at a feedback terminal F, which is at the junction of capacitor 33 and resistor 34. Elements 33–34 serve to diminish undesirable ringing of the trace current, as will be explained further.

Vertical sync pulses 35, obtained from the sync separator, are coupled at a terminal B to a vertical sawtooth generator 36. The output of generator 36 is linearly increasing sawtooth voltage 37 during the trace interval of each vertical deflection cycle. Sawtooth voltage 37 is coupled together with the feedback voltage from terminal F to an amplifier 60. A linearly decreasing inverted output voltage 38 and a linearly increasing output voltage 38a are coupled to a modulator 39. Also coupled to modulator 39 are horizontal retrace pulses 50d, obtained from another secondary winding 25d of horizontal output transformer 25.

During the first portion of vertical trace, modulator 39 couples to the gate of SCR 28 at terminal C horizontal rate pulse width modulated gating pulses 40 in synchronization with retrace pulses 50b. When SCR 28 conducts, current from retrace pulse 50b charges capacitor 30 through the series resonant circuit of inductor 26 and capacitor 30. When the current through SCR 28 has decayed sufficiently to cut off conduction of the SCR, switched mode vertical deflection amplifier 20 is disconnected from capacitor 20 and deflection winding 22. Capacitor 30 then discharges to ground through vertical deflection winding 22 and feedback resistor 31.

The voltage across capacitor 30 is a triangular waveform repeating at a horizontal rate. The peak values of the capacitor voltage linearly decrease in time due to the pulse width modulation of gating pulses 40, whose leading edges are continuously delayed relative to the leading edges of retrace pulses 50b. During the second portion of vertical trace, a similar arrangement, but of continuously advancing pulse width modulated gating pulses 42, is coupled from a terminal D of modulator 39 to the gate of SCR 29. SCR's 28 and 29 thus permit first successively smaller portions of horizontal retrace pulses 50a to charge capacitor 30 and then successively larger portions of the retrace pulses to charge the capacitor. Because of the relatively large inductance of deflection winding 22, the linearly decreasing triangular voltage 41 across capacitor 30 is integrated by the deflection winding into the linearly decreasing sawtooth current 21 which provides for a linear vertical scan of the electron beam.

At the end of trace, the current through deflection winding 22 has reached its peak negative value. Modulator 39 ceases to provide gating pulses for the duration of the retrace interval. Neither of the SCR's conduct, thereby disconnecting switched mode vertical amplifier 20 from the deflection winding 22. Deflection winding 22 and capacitor 30 form a resonant circuit with a period of twice the retrace interval. Current through the deflection winding reverses direction as charge is first stored and then removed from capacitor 30. Both the current through the deflection winding 22 and the voltage across capacitor 30 are sine waves with the former lagging the latter by 90°. The feedback voltage 61 across resistor 31, being in-phase with the current, therefor lags the capacitor voltage by 90°.

At the end of retrace, the current through winding 22 has completely reversed direction and has reached its positive peak value. Modulator 39 begins to provide modulated gating pulses; a new deflection cycle has begun.

The function of elements 33 and 34 will now be explained. FIG. 2A shows the vertical rate sawtooth voltage 37 as a linearly increasing voltage starting from the beginning of trace at time $T_2$. For simplicity, the desired average output voltage, which is the sum of the voltages at terminals S and S1, is depicted in FIG. 2B as a dashed waveform 70a, linearly decreasing during trace, while the gating pulses 40 and 42 are shown in FIG. 2C to be of a constant pulse width. In actuality, the pulse width of pulses 40 and 42 varies at a vertical rate as described above. During trace, the desired average output voltage 70a os in-phase with the desired envelope of triangular voltages 41a across capacitor 30, as shown in FIGS. 2B and 2D, and the desired trace current 21a through deflection winding 22 as shown in FIG. 2E. The feedback voltage has the same waveform as the deflection winding current and is shown in FIG. 2E as a waveform 61a identical with waveform 21a. The feedback voltage 61a is 180° out-of-phase with the input voltage 37, thus providing for proper negative feedback.

During the retrace interval $T_0 - T_2$, the voltage waveform 41b across capacitor 30 is a resonating sine wave leading the resonating sine wave current 21b and feedback voltage 61b by 90°. The feedback voltage is inverted by amplifier 60 and appears as a resonating sine wave error voltage, dotted waveform 70b of FIG. 2B, whose value depends upon the open loop gain of the circuit. The average output voltage during retrace is a ringing sine wave 180° out-of-phase with the ringing feedback voltage and leads the ringing capacitor voltage 41b by 90°. This ringing output voltage at the end of trace will undesirably continue through several more cycles into the trace interval until damped by the switched mode amplifier, thereby adding an undesirable ringing component to the trace current at approximately twice the vertical retrace frequency as shown in FIG. 2E by the waveform 21b from $T_2 - T_5$.

FIG. 2E shows the retrace current 21b at the end of retrace illustratively slightly more positive than the nominally desired value. Thus, at time $T_2$, the current and the feedback voltage are both more positive than desired. The average output voltage being 180° out-of-phase is more negative than desired as shown in waveform 70c. The voltage across capacitor 30, which lags the average output voltage by 90°, is also more negative than desired as shown in waveform 41b. At time $T_2$, SCR 28 conducts, and the circulating resonant currents begin to be damped through the low impedance path to ground of inductor 26 and secondary winding 25b. The circuit now, however, must also attempt to damp the added ringing voltage of the average output voltage caused by the added ringing feedback voltage occurring at the resonant frequency. Damping, however, can occur only when SCR 28 conducts, that is, for only a fraction of the switched mode vertical amplifier duty cycle.

Thus, the ringing of the average output voltage caused by an added undesired ringing of the feedback voltage extends for a relatively long interval $T_2 - T_5$. The ringing component of the output voltage adds a ringing voltage 41b to the envelope voltage across capacitor 30 and adds a ringing component 21b to the trace current. This undesired ringing of the trace current causes streaky horizontal lines to appear on the phosphor screen.

To substantially diminish the ringing component of the trace current caused by the ringing component of the feedback voltage, capacitor 33 and resistor 34, in parallel with capacitor 30, have been added. The function of these two elements is to develop during retrace a first voltage as a cancellation voltage across resistor 34 of an amplitude substantially equal to that of the feedback voltage across resistor 31 but substantially 180° out-of-phase with it. The total voltage coupled to feedback terminal F during retrace is substantially eliminated. The ringing component of the trace current caused by the ringing component of the feedback voltage at the end of retrace is substantially eliminated. The remaining residual ringing is quickly damped by the amplifier as shown by FIG. 2F. The trace current ringing is substantially diminished, lasting only from $T_2$ to $T_3'$, about one-half cycle of the resonant period.

In FIG. 1, capacitor 33 is of relatively small value for sampling the retrace current flowing through capacitor 30. The current through resistor 31 is phase shifted by approximately $-90°$ with respect to the reference voltage across deflection winding 22. The current through resistor 34 is phase shifted by approximately $+90°$ with respect to the same reference voltage which is also across capacitor 33. The value of resistor 34 is chosen to substantially cancel the feedback voltage during retrace. It should be noted that during the vertical trace period, negligible error is introduced into the feedback voltage, since the current flowing through resistor 34, because of the relatively small value of capacitor 33, is much less than the current flowing through resistor 31.

Another arrangement, which also provides for feedback cancellation during vertical retrace, is illustrated in FIG. 3. A voltage divider network comprising resistor 101–103 has replaced capacitor 33 and resistor 34. Feedback terminal F is now located at the junction of resistors 101 and 102. The values of the resistors are so chosen as to provide equal but opposite circulating retrace currents through resistors 31 and 103. The voltage developed across the series combination of resistors 101 and 102 is zero, providing for a zero voltage at feedback terminal F.

Typical values for major components of FIG. 1 are:
Inductor 26, 27=100μH
Deflection Winding 22=3.2mH Capacitor 30 = 3.3μf
Capacitor 33 = 0.033μf
Resistor 31 = 0.47Ω
Resistor 32 = 220Ω
Resistor 34 = 10Ω

What is claimed is:

1. Apparatus comprising:
a deflection winding;
first charge storage means coupled to said deflection winding for forming a resonant circuit therewith during a retrace interval of each deflection cycle for generating a retrace current in said deflection winding during said retrace interval;
a switched mode deflection amplifier having an output terminal coupled to said deflection winding for generating a trace current in said deflection winding during a trace interval of each deflection cycle;
feedback means coupled to said deflection amplifier and responsive to the current in said deflection winding for providing to said deflection amplifier a feedback voltage representative of the current in said deflection winding; and
cancellation means coupled to said deflection winding for providing a first voltage to said deflection amplifier for substantially cancelling said feedback voltage during at least the latter portion of said retrace interval for substantially diminishing a ringing component of said trace current during a first portion of said trace interval.

2. Apparatus according to claim 1 wherein said feedback voltage is cancelled during the entirety of said retrace interval.

3. Apparatus according to claim 1 wherein said cancellation means includes a second charge storage means for sampling said retrace current for providing said first voltage.

4. Apparatus according to claim 3, wherein the current in said second charge storage means is phase shifted with respect to the current in said deflection winding for providing said first voltage.

5. Apparatus according to claim 1 wherein said cancellation means comprises a voltage divider network coupled to said first charge storage means for providing said first voltage.

6. Apparatus according to claim 1 wherein said switched mode deflection amplifier is disconnected from said deflection winding during a substantial portion of said retrace interval.

7. Apparatus according to claim 1 wherein said switched mode deflection amplifier comprises means for providing said first charge storage means with successively smaller portions of a horizontal rate voltage during one part of said trace interval and successively larger portions of said horizontal rate voltage during another part of said trace interval for generating said trace current in said deflection winding.

8. Apparatus according to claim 7 wherein said switched mode deflection amplifier is disconnected from said first charge storage means during a portion of said trace interval for each deflection cycle.

9. Apparatus comprising:
a deflection winding;
a switched mode deflection amplifier with a feedback terminal and having an output terminal coupled to said deflection winding for generating a trace current in said deflection winding during a trace interval of each deflection cycle;
charge storage means coupled to said deflection winding for forming a resonant circuit therewith during a retrace interval of each deflection cycle for generating a resonating retrace current in said deflection winding during said retrace interval;
feedback means coupled to said feedback terminal and responsive to the current in said deflection winding for providing at said feedback terminal a feedback voltage representative of the current in said deflection winding; and
means coupled to said feedback means and said feedback terminal for substantially eliminating said feedback voltage at said feedback terminal during at least the latter portion of said retrace interval for substantially diminishing a ringing component of said trace current during a first portion of said trace interval.

* * * * *